(12) United States Patent
Koyama et al.

(10) Patent No.: US 6,613,658 B2
(45) Date of Patent: Sep. 2, 2003

(54) MIS FIELD EFFECT TRANSISTOR AND METHOD OF MANUFACTURING THE SAME

(75) Inventors: Masato Koyama, Miura-gun (JP); Akira Nishiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/119,014

(22) Filed: Apr. 10, 2002

(65) Prior Publication Data
US 2002/0149065 A1 Oct. 17, 2002

(30) Foreign Application Priority Data
Apr. 13, 2001  (JP) ........................................ 2001-115709

(51) Int. Cl.$^7$ .......................................... H01L 21/3205
(52) U.S. Cl. ...................... 438/591; 438/763; 438/769
(58) Field of Search .................................. 438/216, 287, 438/591, 762–763, 769, 770, 775, 778

(56) References Cited

U.S. PATENT DOCUMENTS

| 6,013,553 A | 1/2000 | Wallace et al. |
| 6,326,670 B1 | 12/2001 | Nishiyama et al. |

*Primary Examiner*—George Fourson
*Assistant Examiner*—Thanh V Pham
(74) *Attorney, Agent, or Firm*—Oblon, Spivak, McClelland, Maier & Neustadt, P.C.

(57) ABSTRACT

There is disclosed a MIS field effect transistor, comprising a silicon substrate, an insulating film formed over the silicon substrate and containing silicon and at least one of nitrogen and oxygen, a metal oxynitride film formed on the insulating film and containing at least one kind of metal atom selected from the group consisting of zirconium, hafnium and a lanthanide series metal, the metal oxynitride film containing nitrogen atom not bonding with the metal atom without metal-nitrogen bond at the density of higher than $10^{19}/cm^3$, and a gate electrode formed on the metal oxynitride film.

11 Claims, 11 Drawing Sheets

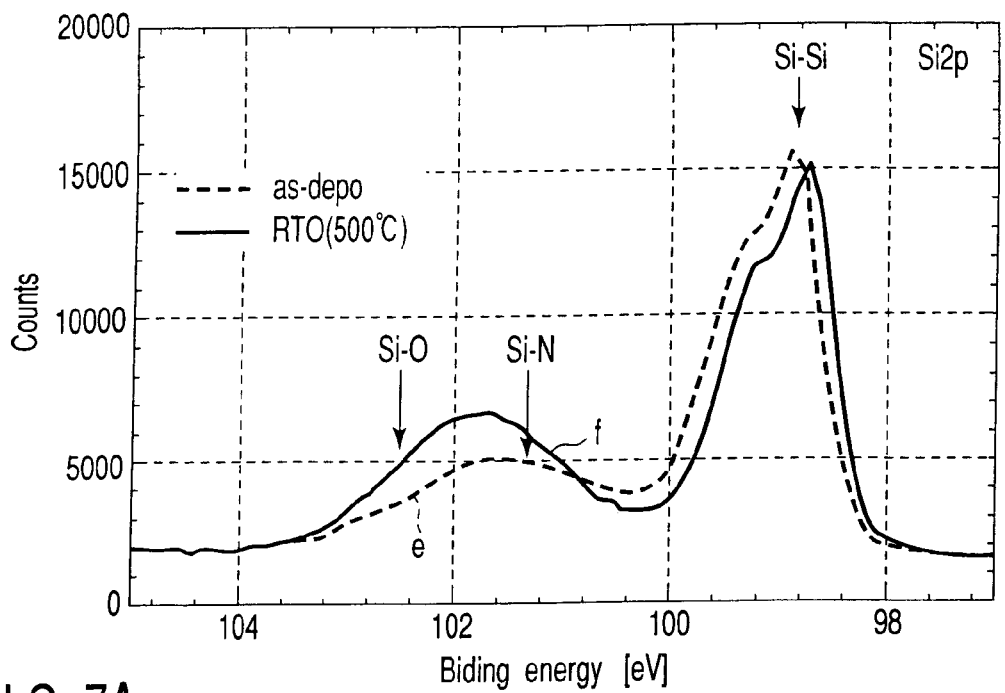
F I G. 7A
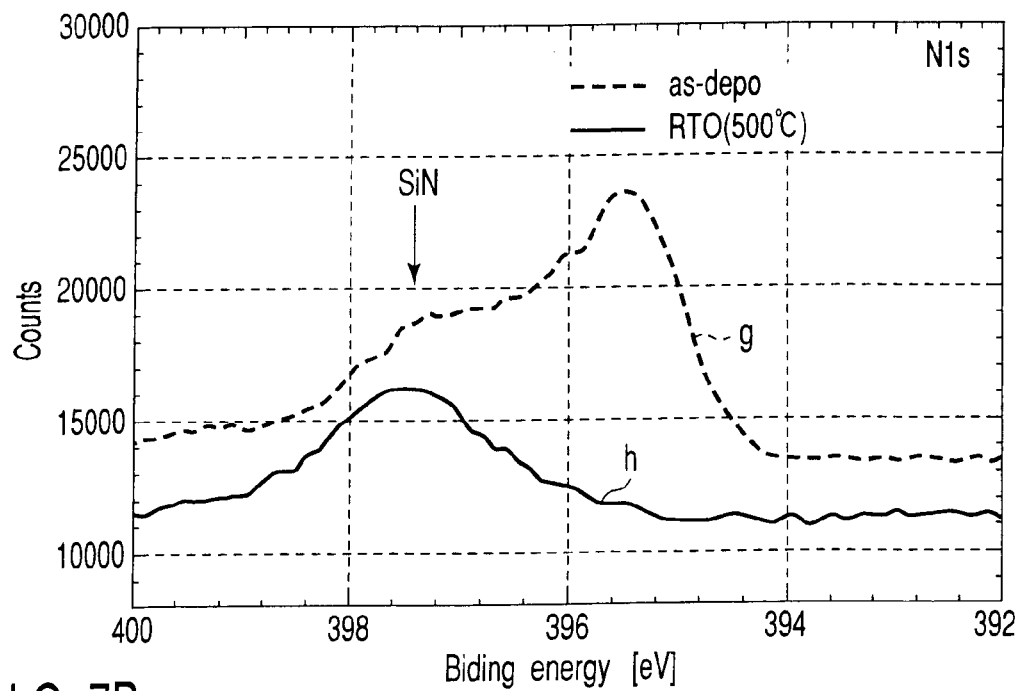
F I G. 7B

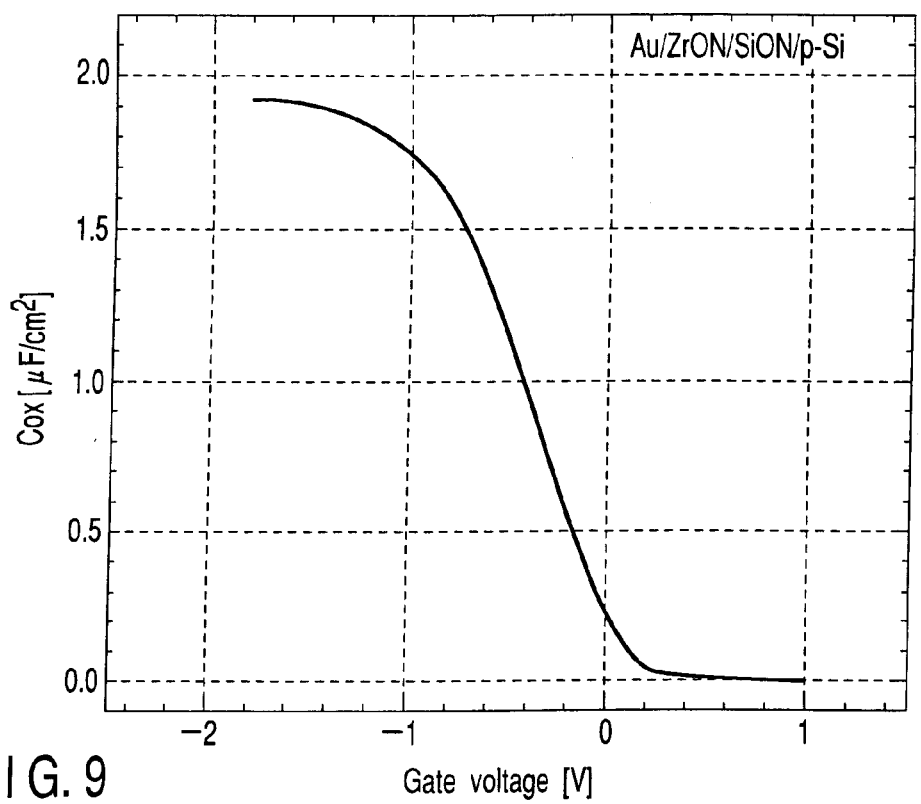
F I G. 9
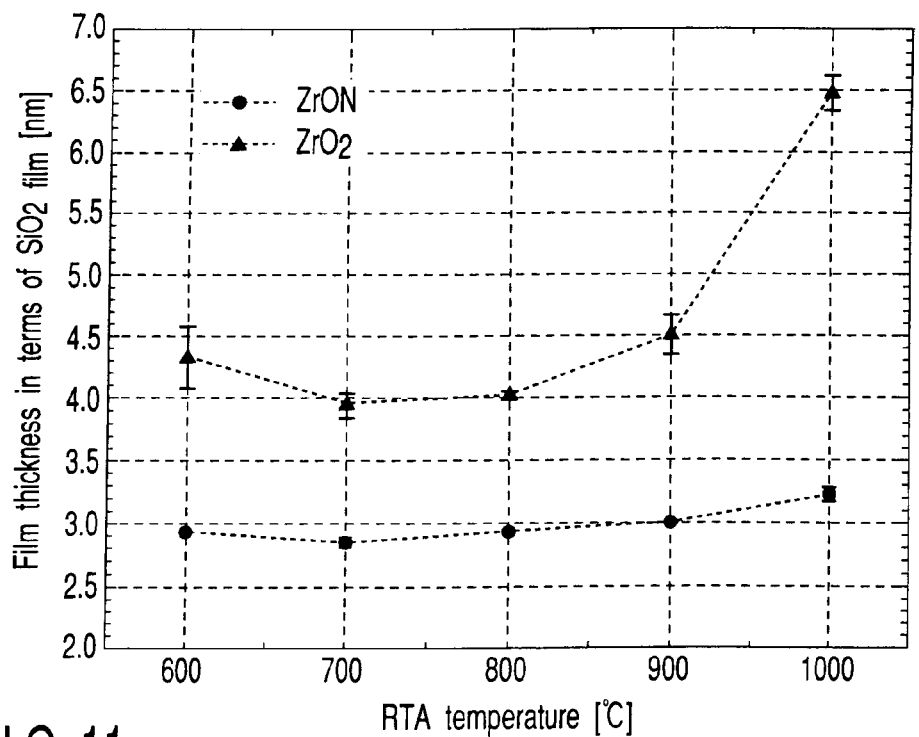
F I G. 11

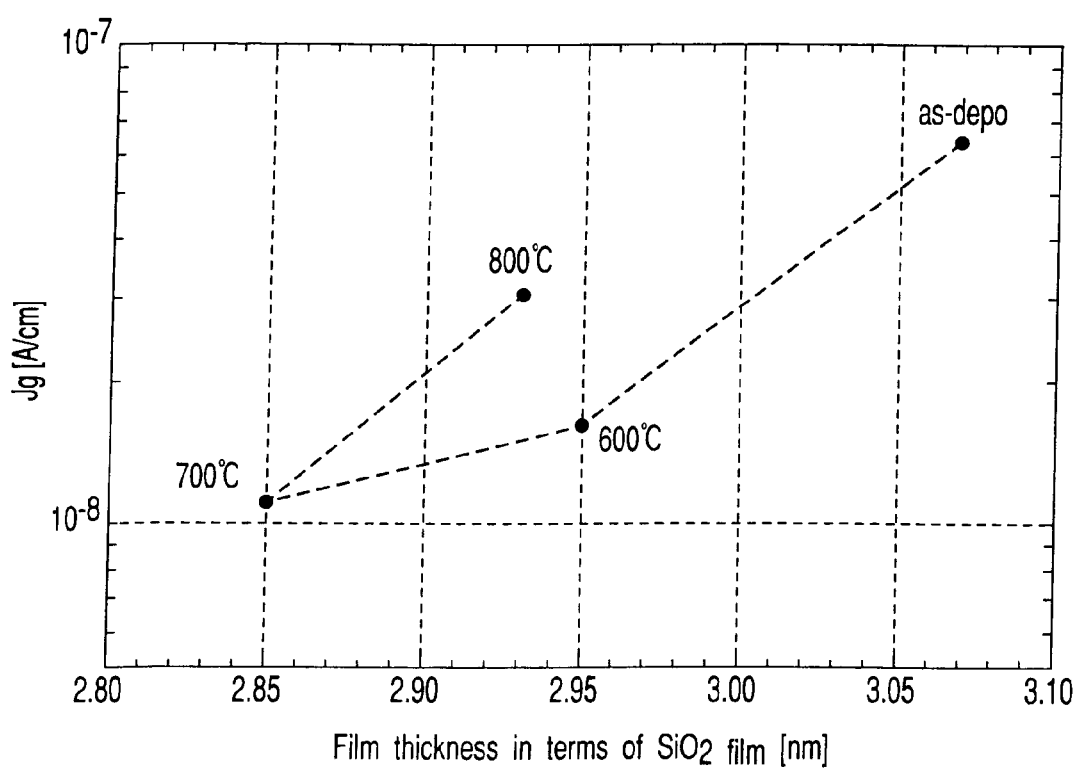
F I G. 12

MIS FIELD EFFECT TRANSISTOR AND METHOD OF MANUFACTURING THE SAME

CROSS-REFERENCE TO RELATED APPLICATIONS

This application is based upon and claims the benefit of priority from the prior Japanese Patent Application No. 2001-115709, filed Apr. 13, 2001, the entire contents of which are incorporated herein by reference.

BACKGROUND OF THE INVENTION

1. Field of the Invention

The present invention relates to a MIS (Metal-Insulator-Semiconductor) field effect transistor and a method of manufacturing the same, particularly, to a MIS field effect transistor comprising a gate insulating film formed of a laminated insulating film comprising of a metal oxynitride film containing at least one metal selected from the group consisting of zirconium, hafnium and a lanthanoide series metal and an interface insulating film containing silicon and a method of manufacturing the same.

2. Description of the Related Art

A gate insulating film included in a CMOS (Complementary Metal-Oxide-Semiconductor) device in the sub-0.1 μm era requires such a high specification as 1.5 nm equivalent oxide thickness. A $SiO_2$ film having a thickness of 1.5 nm is poor in insulating properties and, thus, cannot be put to a practical use even in a logic device in which a high importance is placed on the high operating speed rather than on the increase in the power consumption caused by a leak current. Also, it is said indisputable that increasing demands are expected for an LSI device for a personal portable electronic equipment. The low power consumption is the greatest factor required for such an LSI device. Such being the situation, it is considered absolutely necessary to introduce a novel material that is markedly low in the leak current, compared with the conventional material of $SiO_2$, for forming a gate insulating film the leak current density of which occupies a large portion of the power consumption of the entire device.

In order to realize an insulating film capacity of 1.5 nm equivalent oxide thickness and to obtain low leak characteristics, it is effective to utilize a material (high-K material) having a relative dielectric constant higher than that of $SiO_2$ to increase the physical film thickness. For example, in the case of utilizing a material having a relative dielectric constant 10 times as much as that of $SiO_2$, it is possible to set the physical film thickness required for obtaining a performance of 1.5 nm equivalent oxide thickness at 15 nm. As a result, it is possible to avoid the insulation breakdown of the film caused by the direct tunnel current. Incidentally, the high-K material noted above represents in general a metal oxide in which the high polarization based on its physical and chemical structure provides its high dielectric constant.

However, the metal oxide providing the high-K material has properties that are clearly inappropriate compared with $SiO_2$ when the metal oxide is introduced into an LSI device as a gate insulating film. For example, the metal oxide in question is crystallized easily under relatively low temperatures, i.e., typically at 400 to 500° C.

It should be noted that $SiO_2$ or SiON used for forming a gate insulating film in the conventional LSI does not give rise to a change in the crystal state in any case to remain amorphous. The amorphous state prevents the impurity diffusion into silicon to improve the flatness of the insulating film and produces the effects that the leak current is lowered and that the nonuniformity in the characteristics among the elements of the LSI is suppressed. It follows that it is very important to use the insulating material capable of remaining amorphous for improving the yield of the LSI manufacture and the performance of the produced LSI device. Where the gate insulating film is crystalline, particularly, polycrystalline, it is expected that the particular effects pointed out above, which were naturally obtained in the past, may be lost to lower the yield and, in addition, to make it difficult to obtain the desired performance. Under the circumstances, required is a gate insulating film material, which has a dielectric constant higher than that of $SiO_2$ and which is not easily crystallized under high temperatures employed in the LSI process.

A mixed oxide including silicon oxide and an oxide of a metal other than silicon is being studied as one of the materials satisfying the requirements pointed out above. The typical examples of the particular mixed oxide include, for example, Ti—Si—O, Zr—Si—O, Hf—Si—O and La—Si—O. These materials are capable of remaining amorphous even under such a high temperature as 1,000° C., or capable of retaining an amorphous state required for a matrix of an insulating film, though crystallization takes place partially in these mixed oxides.

However, such a mixed oxide gives rise to the problem that, if silicon is added to the mixed oxide for improving the amorphous state, the relative dielectric constant of the mixed oxide is markedly lowered. In view of the fact that the relative dielectric constant of the mixed oxide (or an alloy oxide) is determined by the average dielectric constant of the metal oxide and $SiO_2$, the relative dielectric constant falls within a range of between 10 and 15 in the case where the alloy is prepared on the basis of the component ratio of, for example, 1:1. Further, where a metal oxide is added to $SiO_2$ at a high ratio of 1:1, the mixed material fails to maintain the amorphous state in general. In practice, it is impossible for the mixed material to maintain the amorphous state unless the mixing ratio of silicon oxide to the metal oxide is about 3:1. The relative dielectric constant of the mixed material in this case is lowered to 10 or less without fail. In view of the fact that the effective relative dielectric constant of, for example, SiON used for forming a gate insulating film of a device actually used nowadays is about 6, the relative dielectric constant of the silicon-metal oxide mixed material that is studied nowadays produces the effect of increasing the physical film thickness to a level only about 1.5 times as much as that of SiON. Even if the leak current can be relatively lowered by the use of the particular mixed material, it is expected that the mixed material will be a material of a short life that can be utilized in a device of only one era.

As described above, for improving the amorphous state, an alloy oxide containing silicon and another metal is used mainly for providing a material of the high-K gate insulating film replacing the conventional $SiO_2$ material and SiON material. However, the relative dielectric constant of the alloy oxide noted above is only about 10 and, thus, the alloy oxide fails to provide a material of a gate insulating film that can be used over a plurality of eras.

BRIEF SUMMARY OF THE INVENTION

An object of the present invention is to provide a MIS field effect transistor comprising a gate insulating film containing a high-K material and having a relative dielectric constant substantially equal to that of a metal oxide.

Another object of the present invention is to provide a method for manufacturing a MIS field effect transistor comprising a gate insulating film capable of markedly suppressing the crystallization of the high-K material during the heat treatment to improve the resistance to heat and having a relative dielectric constant substantially equal to that of the metal oxide.

According to one aspect of the present invention, there is provided a MIS field effect transistor, comprising:

a silicon substrate;

an insulating film formed over the silicon substrate and containing silicon and at least one of nitrogen and oxygen;

a metal oxynitride film formed on the insulating film and containing at least one kind of metal atom selected from the group consisting of zirconium, hafnium and a lanthanide series metal, the metal oxynitride film containing nitrogen atom not bonding with the metal atom without metal-nitrogen bond at the density of higher than $10^{19}/cm^3$; and a gate electrode formed on the metal oxynitride film.

According to another aspect of the present invention, there is provided a MIS field effect transistor, comprising:

a silicon substrate;

an insulating film formed over the silicon substrate and containing silicon and at least one of nitrogen and oxygen;

a metal oxynitride film formed on the insulating film and containing at least one kind of metal atom selected from the group consisting of zirconium, hafnium and a lanthanide series metal, the nitrogen atom being substantially bonded to nitrogen or oxygen; and a gate electrode formed on the metal oxynitride film.

Further, according to still another aspect of the present invention, there is provided a method for manufacturing a MIS field effect transistor, comprising:

supplying at least one metal selected from the group consisting of zirconium, hafnium and a lanthanide series metal over a surface of a silicon substrate together with nitrogen to form a metal nitride film;

annealing the surface of the silicon substrate and the metal nitride film to convert the metal nitride film into metal oxynitride film and to form an insulating film containing at least one of nitrogen and oxygen and silicon between the surface of the silicon substrate and the metal oxynitride film, thus obtaining a gate insulating film; and forming a gate electrode on the gate insulating film.

BRIEF DESCRIPTION OF THE SEVERAL VIEWS OF THE DRAWING

FIGS. 7A and 7B are XPS spectra each showing the coupled state of an interfacial insulating film included in a MIS field effect transistor according to one embodiment of the present invention;

FIG. 9 is graph showing the experimental data on the relationship between the capacitance and the gate voltage, said relationship showing the interfacial characteristics between the laminate structure of a zirconium oxynitride film/interfacial insulating film and the silicon substrate in a MIS field effect transistor according to one embodiment of the present invention;

FIG. 11 is a graph showing the experimental data on the resistance to oxidation of a zirconium oxynitride film/interfacial insulating film laminate structure in a MIS field effect transistor according to one embodiment of the present invention;

FIG. 12 is a graph showing the experimental data supporting as an example the improvement in the performance achieved by a post annealing treatment applied to a zirconium oxynitride film/interfacial insulating film laminate structure included in a MIS field effect transistor according to one embodiment of the present invention;

DETAILED DESCRIPTION OF THE INVENTION

Figure 1A:
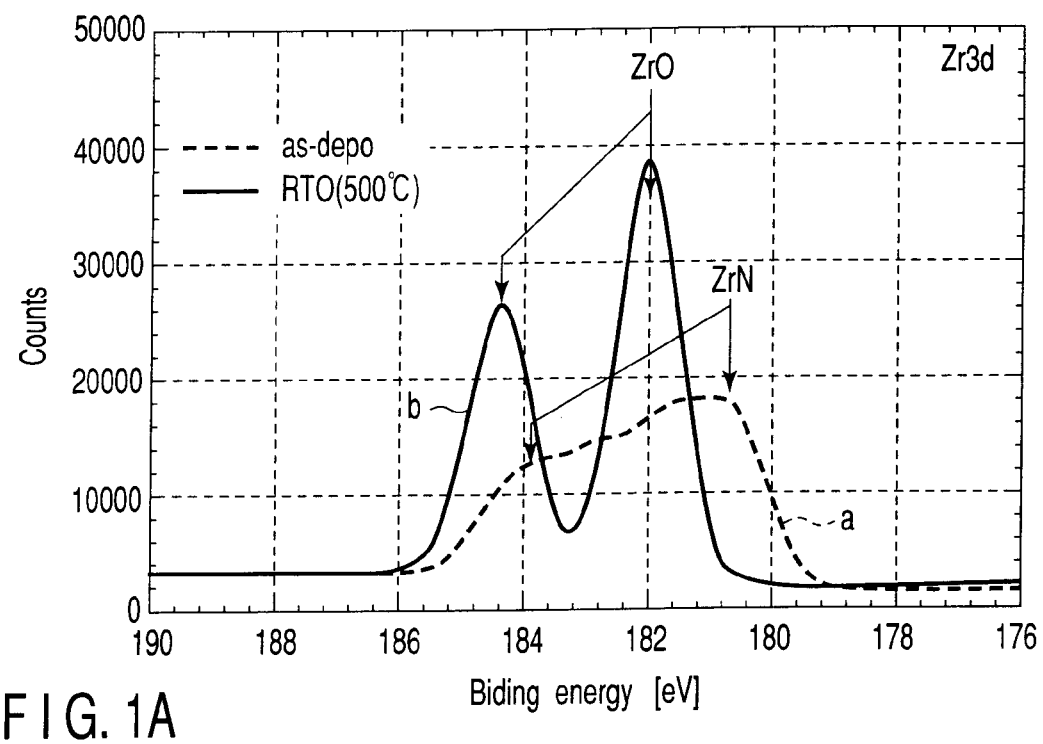
FIGS. 1A and 1B are XPS spectra each showing the coupled state of the zirconium oxynitride film in a MIS field effect transistor according to one embodiment of the present invention.

Crystallization takes place under low temperatures of about 400 to 500° C. in any of a zirconium oxide film, a hafnium oxide film and an oxide film of a lanthanide series metal. The present inventors have found that the crystallization temperature of the metal oxide film noted above is elevated if nitrogen is added to the metal oxide film to form a metal oxynitride. Unlike the case where silicon is added to a metal oxide film, the metal oxynitride film formed by adding nitrogen to a metal oxide film is not scarcely deteriorated in a relative dielectric constant, compared with a metal oxide film. One embodiment of the present invention is based on the particular finding. Particularly, it is absolutely necessary in the present invention that the nitrogen atom contained in the metal oxynitride film does not form directly a chemical bond with a metal atom and, thus, the metal oxynitride film is substantially free from the bond between the metal atom and the nitrogen atom. The nitrogen atom is bonded to another nitrogen atom, to an oxygen atom or to a hydrogen atom within the metal oxynitride film. Alternatively, it is necessary to exist nitrogen atom not bonding with the metal atom, and for the density of bonding between the metal atom and the nitrogen atom within the metal oxynitride film to be not larger than $10^{19}/cm^3$.

The metal oxynitride film, which is used as a gate insulating film included in a MIS field effect transistor (FET), is required to be high in insulating properties and in the dielectric constant. The metal-nitrogen bond is a chemical bond exhibiting a metallic behavior and is low in the polarization amount. In other words, the metal-nitrogen bond deteriorates the insulating properties of the film and decreases the polarization amount to decrease the relative dielectric constant of the film. Such being the situation, it is reasonable to state that the performance of the metal oxynitride film used as a gate insulating film is improved with decrease in the density of the metal-nitrogen bonds. The upper limit of the density of the metal-nitrogen bonds satisfying the requirements of at least the gate insulating film will now be described.

First of all, the relative dielectric constant is a physical amount reflecting the accumulated amount of the polarization amount within the film and, thus, an influence is produced in a volume ratio of the metal-nitrogen bond to the metal-oxygen bond.

For example, even if the metal-nitrogen bonds are contained in the film in an amount of 10%, the relative dielectric constant is lowered by only 10%. Where the relative dielectric constant is 20, the value is decreased by only 2, i.e., 10% of 20, to be lowered to 18. In this sense, the influence given by the metal-nitrogen bonds to the relative dielectric constant is small.

On the other hand, the influence of the metal-nitrogen bond is considered to be quite different in respect of the insulating properties. In general, where a metallic region is increased in an insulating film, the insulating film exhibits the behavior that the insulating properties are abruptly deteriorated with respect to a certain critical value rather than the linear deterioration of the insulating properties in accordance with the increase in the volume of the metal region. The metal-insulator transition phenomenon is one example of the particular behavior exhibited by the insulating film. If the number of metallic impurity atoms added to the insulator is increased to about $1/1000$ of the total number of atoms, the insulator comes to exhibit a metallic behavior. Such being the situation, it is necessary for the density of the metal-nitrogen bonds in the metal oxynitride film to be not higher than $1/1000$, i.e., not higher than $10^{19}/cm^3$.

If a metal-nitrogen bond is formed in the metal oxynitride film, problems such as generation of the defect in the film and decrease of the relative dielectric constant are generated. However, one embodiment of the present invention permits completely avoiding these problems. Therefore, it is very important to define that the metal atom does not directly forms a chemical bond with the nitrogen atom in the metal oxynitride film. It has already been confirmed experimentally that the particular type of the chemical bond permits sufficiently producing the effect of elevating the crystallization temperature of the film.

Incidentally, zirconium, hafnium and a mixture thereof have a sufficiently large free energy for forming the oxides thereof and are highly stable thermally. The lanthanide series metal such as La, Ce, Pr, Nd, Pm, Sm, Eu, Gd, Tb, Dy, Ho, Er, Tm, Yb and Lu are also thermally stable. Therefore, the metals contained in the metal oxynitride film have been limited to zirconium, hafnium, lanthanoide series metals, and mixtures thereof.

Further, in a MIS field effect transistor according to one embodiment of the present invention, an interfacial insulating film is formed between the metal oxynitride film described above and the silicon substrate, and the interfacial insulating film thus formed contains silicon and at least one of nitrogen and oxygen. By forming the particular interfacial insulating film, it is possible to ensure a distance between the polar molecular binding contained in the metal oxynitride film in a large amount and the silicon substrate. As a result, it is possible to remove the carrier scattering factor relative to the channel formed in a surface region of the silicon substrate to further improve the interfacial electrical characteristics between the silicon substrate and the insulating film.

The gate insulating film included in a MIS field effect transistor according to one embodiment of the present invention is formed of a laminate structure comprising the interfacial insulating film noted above and the metal oxynitride film formed directly on the interfacial insulating film. Incidentally, in order to form a laminated insulating film comprising the interfacial insulating film and the metal oxynitride film in an equivalent oxide thickness not larger than 1.5 nm, it is necessary for the interfacial insulating film to have a thickness not larger than 1 nm. Such being the situation, it is desirable for the interfacial insulating film to have an equivalent oxide thickness not larger than 1 nm.

It is possible for at least one kind of a metal atom selected from the group consisting of zirconium, hafnium and the lanthanide series metals to be contained in at least a part of the interfacial insulating film. In this case, the relative dielectric constant of the interfacial insulating film is increased to make it possible to obtain the effect of effectively decreasing the equivalent oxide thickness.

One embodiment of the present invention will now be described in detail.

In one embodiment of the present invention, nitrogen is added to a metal oxide film to form a metal oxynitride film in place of adding silicon to a metal oxide film to improve the amorphous state as in the prior art. The metal oxynitride film is formed by supplying at least one kind of a metal selected from the group consisting of zirconium, hafnium and the lanthanoide series metal onto a silicon substrate together with nitrogen to form a nitride film comprising at least one kind of a metal selected from the group consisting of zirconium, hafnium and the lanthanide series metals, followed by oxidizing the nitride film thus formed.

The metal oxynitride film in one embodiment of the present invention will now be described, with a zirconium oxynitride film taken up as an example.

In the first step, a zirconium nitride film was formed on a silicon substrate as a metal nitride film, followed by oxidizing the resultant zirconium nitride film at 500° C. The film after the oxidation was examined by XPS (X-ray Photoelectron Spectroscopy). Detected were zirconium, oxygen and nitrogen, which clearly supports that formed was a zirconium oxynitride film. The bond state of the zirconium oxynitride film thus formed will now be explained with reference to FIGS. 1A and 1B.

FIG. 1A is an XPS spectrum showing the change in the bond state of zirconium before and after the oxidizing treatment applied to the zirconium nitride film. Curve "a" in FIG. 1A shows the bond state of zirconium in the zirconium nitride film immediately after deposition, and curve "b" denotes the bond state of zirconium in the zirconium oxynitride film after application of the oxidizing treatment to the zirconium nitride film by the heating at 500° C. A peak denoting the Zr—N bond appears in curve "a" indicating the state immediately after deposition of the zirconium nitride film. On the other hand, the Zr—N bond was not recognized at all and the Zr—O bond alone was recognized in the XPS spectrum of the zirconium oxynitride film after the oxidizing treatment (curve "b").

Figure 1B:
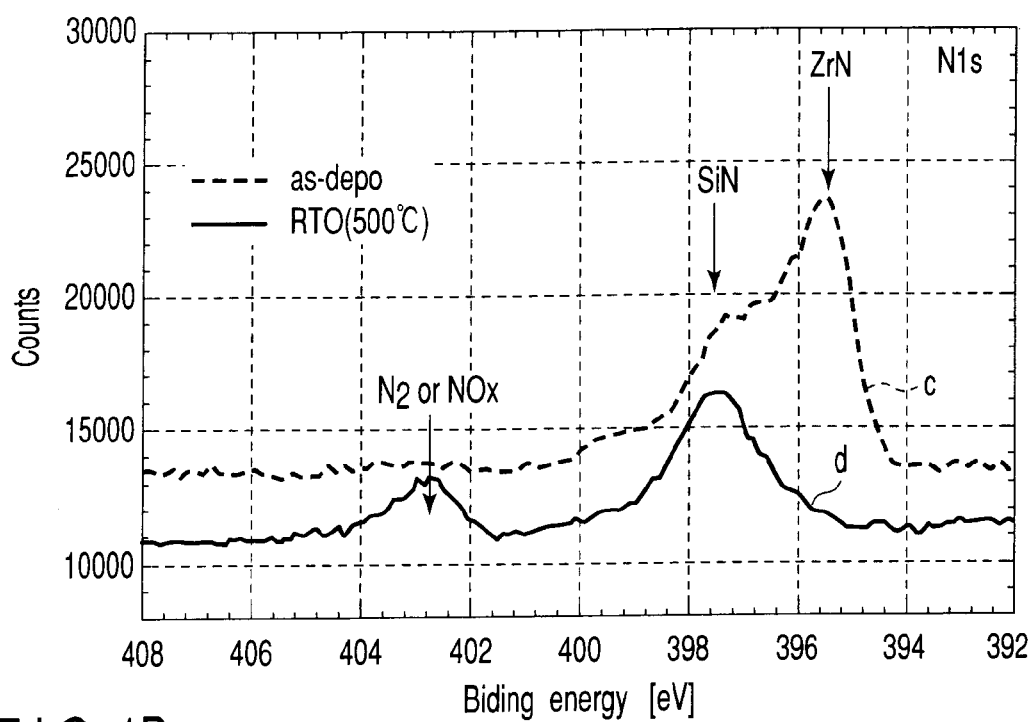

FIG. 1B is an XPS spectrum showing the bond state of nitrogen before and after the oxidizing treatment applied to the zirconium nitride film. Curve "c" in FIG. 1B shows the bond state of nitrogen in the zirconium nitride film immediately after deposition, and curve "d" denotes the bond state of nitrogen in the zirconium oxynitride film after application of the oxidizing treatment to the zirconium nitride film by the heating at 500° C. As apparent from curve "c", the Zr—N bond is detected from the zirconium nitride film immediately after deposition. However, the signal of the Zr—N bond disappears after the oxidizing treatment as apparent from curve "d", and a peak relating to the bond of N is newly generated in the vicinity of 403 eV of energy. The newly generated peak is ascribed to the N—N bond or the N—O bond.

As described above, one embodiment of the present invention has a feature in chemical bond that zirconium forms a chemical bond with oxygen but does not form a chemical bond with nitrogen within the zirconium oxynitride film. Such a feature of the zirconium oxynitride film is related to the fact that the free energy for forming zirconium oxide is very large. To be more specific, since the Zr—O bond is more stable in energy than the Zr—N bond, it is quite natural for the Zr—N bond to be cut to form the Zr—O bond.

The zirconium oxynitride film having the particular state of the chemical bond has been formed for the first time by the method according to one embodiment of the present invention. The zirconium oxynitride film is formed by depositing a zirconium nitride film on the silicon substrate, followed by oxidizing the nitride film thus formed. As a result, it has been made possible to markedly decrease the Zr—N bond within the zirconium oxynitride film to permit the zirconium oxynitride film to be substantially free from the Zr—N bond.

The originality and the usefulness of this embodiment of the present invention will now be described while making comparison between the conventional method of forming a zirconium oxynitride film and the method according to one embodiment of the present invention with reference to the accompanying drawings.

Figure 2:
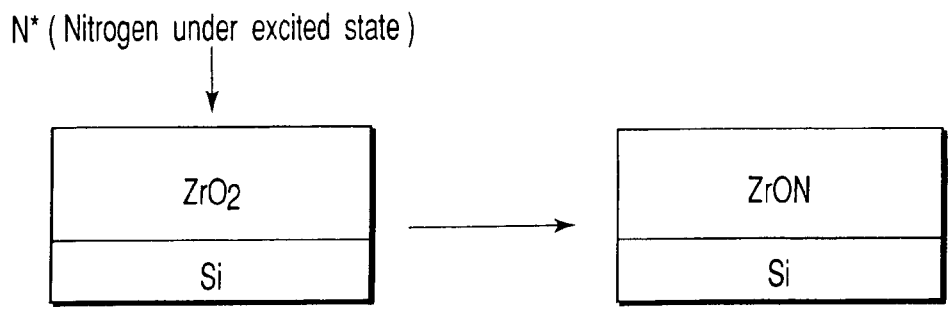
FIG. 2 schematically shows the conventional method of forming a zirconium oxynitride film.

FIG. 2 schematically shows the conventional method of forming a zirconium oxynitride film disclosed in U.S. Pat. No. 6,013,553. In this conventional method, a zirconium oxide film ($ZrO_2$) is formed first on a silicon substrate, followed by nitriding the zirconium oxide film by using $N^*$ under an excited state to form a zirconium oxynitride film (ZrON), as shown in the drawing. Since nitrogen under an excited state is used for nitriding the zirconium oxide film, this method gives rise to the problem that the zirconium-nitrogen bond, which is in a metastable bonding state, tends to be formed easily.

Figure 3:
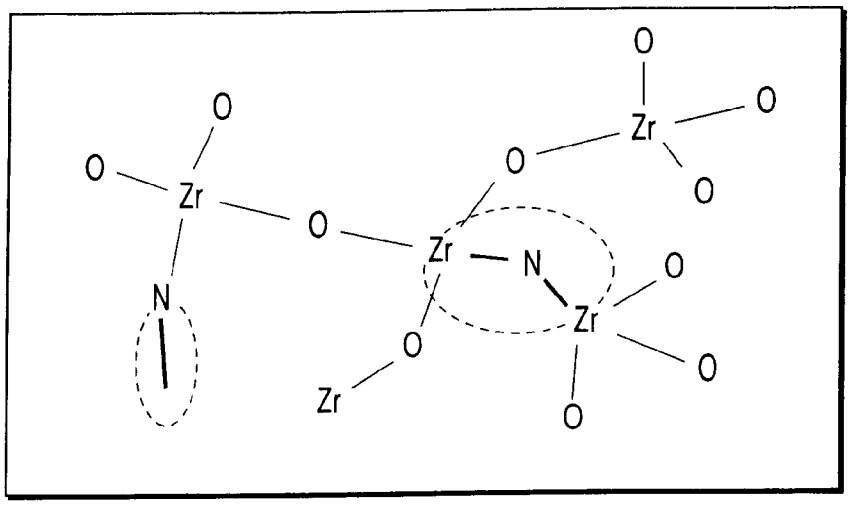
FIG. 3 schematically shows the coupled state of a zirconium oxynitride film formed by the conventional method.

The zirconium-nitrogen bond formed in the film disturbs the stable bonding network of the zirconium oxide film to form a defect structure, as schematically shown in FIG. 3. Alternatively, even if the zirconium-nitrogen bond does not have a free valency provisionally to form a stable state, the zirconium-nitrogen bond is essentially unstable in energy, with the result that it is highly possible for the zirconium-nitrogen bond to generate a latent defect to markedly deteriorate the reliability of the insulating film.

Figure 4:
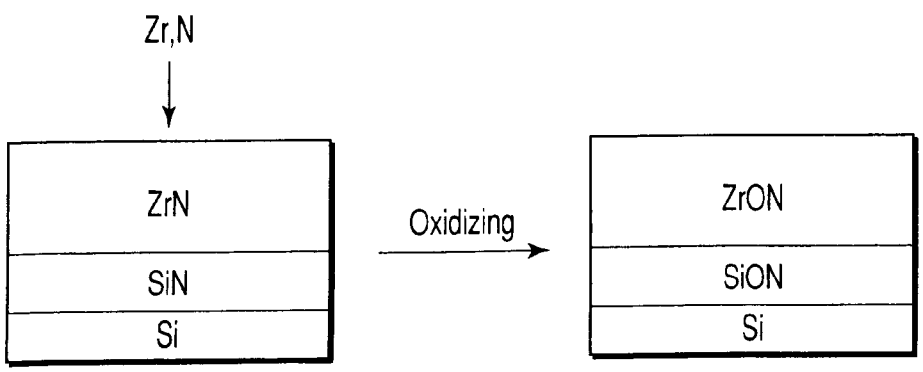
FIG. 4 schematically shows the method of forming a zirconium oxynitride film included in a MIS field effect transistor according to one embodiment of the present invention.
Figure 5:
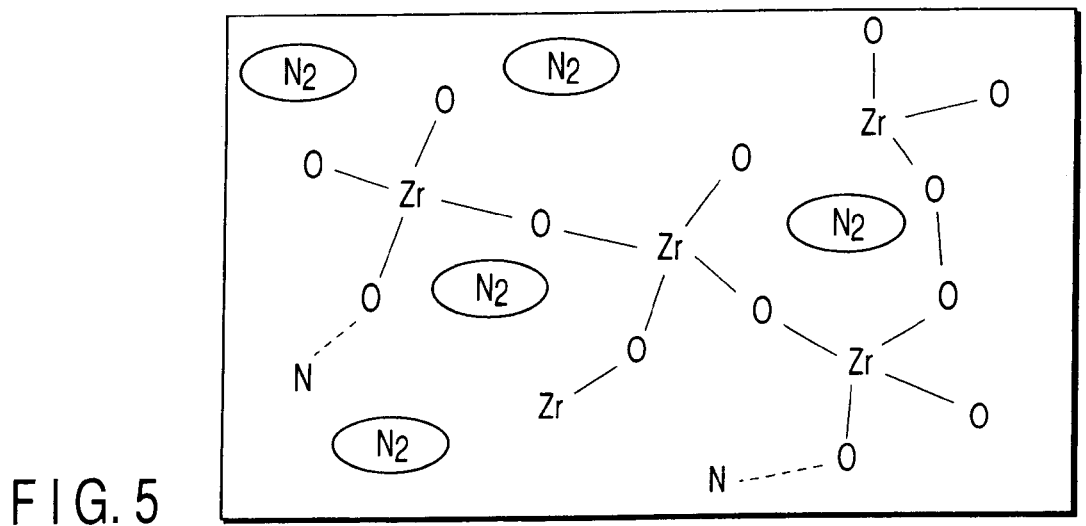
FIG. 5 schematically shows the coupled state of a zirconium oxynitride film formed by the method according to one embodiment of the present invention.

FIG. 4 schematically shows the process of forming a zirconium oxynitride film in the method according to one embodiment of the present invention. In this embodiment, a zirconium nitride film is formed on a silicon substrate, followed by oxidizing the nitride film to form a zirconium oxynitride film. It should be noted that the zirconium-nitrogen bond is markedly unstable in energy, compared with the zirconium-oxygen bond. As a result, the zirconium-oxygen bond is substituted substantially completely for the zirconium-nitrogen bond by oxidizing the zirconium nitride film under the conditions close to the state of equilibrium. As a result, it is possible to form a zirconium oxynitride film having a bonding state comprising mainly of Zr—O bonds as shown in FIG. 5. It follows that it is possible to form easily a zirconium oxynitride film that does not include the zirconium-nitrogen bond.

Figure 6:
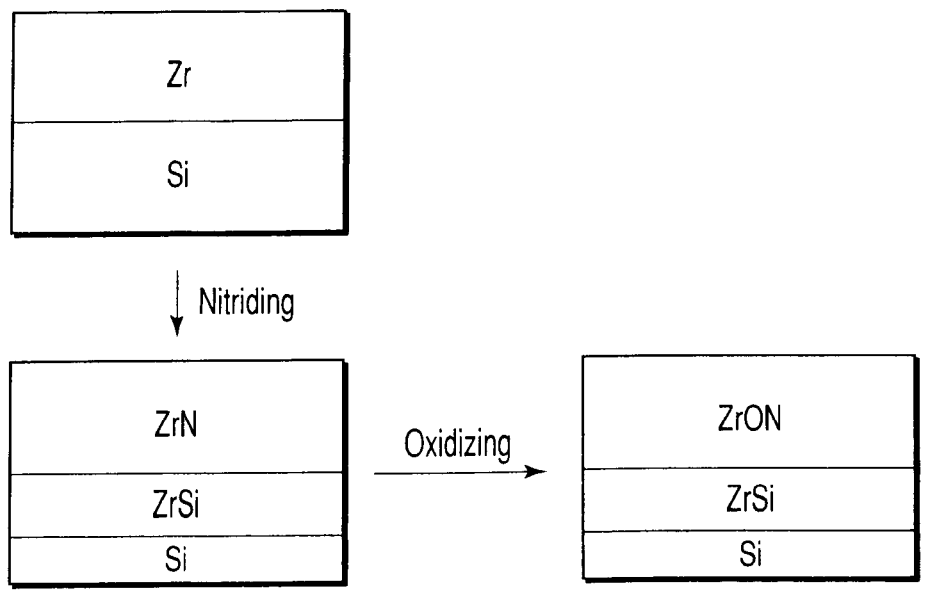
FIG. 6 schematically shows the conventional method of forming a zirconium oxynitride film.

Also, in the conventional method disclosed in U.S. Pat. No. 6,013,553, a metal zirconium film is formed first on a silicon substrate, followed by nitriding the metal zirconium film to form a zirconium nitride film, as shown in FIG. 6. Then, an oxidizing treatment is applied to the zirconium nitride film to form a zirconium oxynitride film. In this method, a zirconium nitride film is oxidized, though the U.S. Patent specification quoted above does not clearly describe the oxidizing process. In this conventional method, however, zirconium silicide (ZrSi) is formed in the interface between the silicon substrate and the zirconium oxynitride film in the process of nitriding the metal zirconium film, as shown in FIG. 6. It should be noted that zirconium metal is chemically active, making it unavoidable for the zirconium metal to react with the silicon atom that is also active chemically to form zirconium silicide.

On the other hand, in the method according to this embodiment of the present invention, zirconium forms a bond with nitrogen in the step of forming the zirconium nitride film and, thus, it is impossible for zirconium to perform a chemical reaction with silicon. It is not allowed to form the zirconium silicide under the insulating film as the conventional method in view of the construction of the device. Incidentally, zirconium is nitrided in the conventional method, followed by oxidizing the resultant zirconium nitride film. Where zirconium silicide referred to previously is oxidized in the oxidizing process noted above, it is conceivable for zirconium silicide to be changed into an insulating film to eliminate the problem in terms of construction of the insulating film. However, it is known to the art that zirconium atoms are diffused into the silicon substrate during the reaction to form zirconium silicide, giving rise to the problem that it is unavoidable for the electrical characteristics of the device to be deteriorated by the diffused metal zirconium atoms.

As described above, it was impossible to obtain by the conventional method an insulating film, which permits suppressing the deterioration of the device characteristics accompanying the reaction between zirconium and silicon and in which the constituting atoms have a bonded state as shown in FIG. 5.

In this embodiment of the present invention, the bond between the metal atom and the nitrogen atom is substantially not contained in the zirconium oxynitride film. In addition, this embodiment of the present invention is featured in that an interfacial insulating film having a thickness not larger than 1 nm equivalent oxide thickness is formed between the zirconium oxynitride film and the silicon substrate. The physical features of the interfacial insulating film in this embodiment of the present invention will now be described with reference to FIGS. 7A and 7B.

FIG. 7A is an XPS spectra each showing the bonded state of silicon in the interface between the zirconium nitride film and the silicon substrate and the bonded state of silicon in the interfacial insulating film formed at the interface between the zirconium oxynitride film and the silicon substrate. Curve "e" shown in FIG. 7A denotes the bonded state of silicon in the interface between the zirconium nitride film immediately after deposited and the silicon substrate. On the other hand, curve "f" in FIG. 7A denotes the bonded state of silicon in the interfacial insulating film between the zirconium oxynitride film obtained by the heating at 500° C. and the silicon substrate. As apparent from curve "e", the interface under the zirconium nitride film has a feature of the silicon-nitrogen bond. On the other hand, curve "f" supports that, after the oxidation by the heating at 500° C., the bonded state of silicon within the film is slightly shifted from the silicon-nitrogen bond toward the energy state of the silicon-oxygen bond. In other words, the interfacial insulating film formed at the interface between the zirconium oxynitride film and the silicon substrate contains silicon oxynitride as a main component.

FIG. 7B is an XPS spectrum each showing the bonded state of nitrogen in the interface between the zirconium nitride film and the silicon substrate and the bonded state of nitrogen in the interfacial insulating film formed at the interface between the zirconium oxynitride film and the silicon substrate. Curve "g" in FIG. 7B denotes the bonded state of nitrogen in the interface between the zirconium nitride film immediately after the deposition and the silicon substrate, with curve "h" denoting the bonded state of nitrogen in the interfacial insulating film at the interface between the zirconium oxynitride film obtained by the heat treatment at 500° C. and the silicon substrate. As apparent from curve "g", the silicon-nitrogen bond is contained only slightly in the interface between the zirconium nitride film and the silicon substrate. On the other hand, a large number of silicon-nitrogen bonds are contained in the interfacial insulating film formed at the interface between the zirconium oxynitride film formed by the heat treatment at 500° C. and the silicon substrate, as apparent from curve "h". This indicates that nitrogen atoms are released in the stage of oxidizing the zirconium nitride film, and the released nitrogen atoms are involved in the formation of a new interfacial insulating film.

This embodiment of the present invention has made it possible for the first time to form the interfacial insulating film having the particular feature noted above. In this embodiment of the present invention, a zirconium nitride film is formed first on a silicon substrate, followed by oxidizing the zirconium nitride film to form a zirconium oxynitride film. To be more specific, the zirconium nitride film is formed under an atmosphere containing nitrogen under excited state. In this step, some of the silicon atoms present on the surface of the silicon substrate are bonded to nitrogen atoms. Further, a zirconium nitride film is formed, followed by oxidizing the zirconium nitride film to form a zirconium oxynitride film. In the oxidizing step, the silicon-nitrogen bond on the uppermost surface of the silicon substrate, which plays the role of suppressing the re-oxidation of the silicon substrate, is taken into the interfacial insulating film as a part of the interfacial insulating film. It should also be noted that the nitrogen atoms released from the zirconium-nitrogen bonds by the oxidation of the zirconium nitride film are partly diffused to the outside of the film, partly remain inside the film, and are involved partly in the formation of the interfacial layer with the silicon substrate. The nitrogen atoms remaining inside the film serve to improve the heat resistance of the insulating film. On the other hand, the nitrogen atoms involved in the formation of an interfacial layer produce the effect of markedly suppressing the undesired re-oxidation of the silicon substrate in the oxidizing step of the zirconium nitride film. After the particular effect has been produced, the nitrogen atoms need not remain in the zirconium oxynitride film.

Figure 8A:
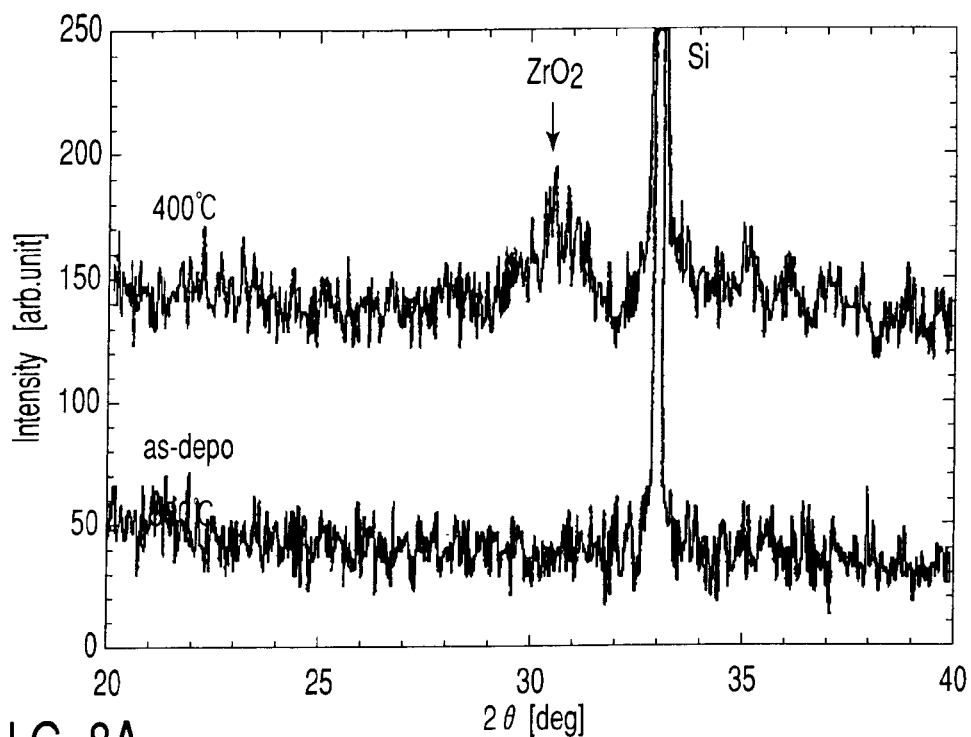
FIGS. 8A and 8B are XPS spectra each showing the effect of elevating the crystallization temperature produced by a zirconium oxynitride film used in a MIS field effect transistor according to one embodiment of the present invention.
Figure 8B:
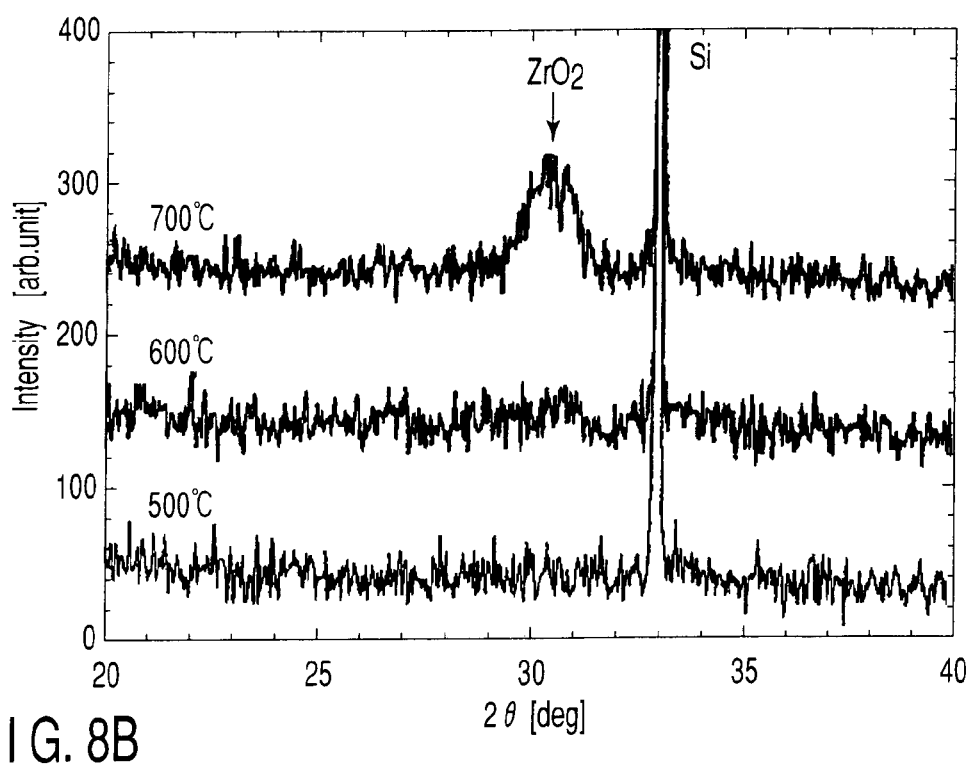

The function of suppressing the crystallization of the zirconium oxynitride film in this embodiment of the present invention will now be described. FIGS. 8A and 8B are XRD (X-Ray Diffraction) spectra for looking into the crystal state of a thin film. It is known to the art that transition to a crystal state takes place in a zirconium oxide film under temperatures not higher than 400° C.

FIG. 8A shows XRD spectra of a zirconium oxide film immediately after the deposition and after a heat treatment at 400° C. FIG. 8A shows that the zirconium oxide film is allowed to exhibit a crystal peak of a sufficiently strong intensity by the heat treatment at 400° C., supporting that the crystal state of the film was changed.

FIG. 8B is a graph showing the behavior of the zirconium oxynitride film relative to a heat treatment in this embodiment of the present invention. In this experiment, a zirconium oxynitride film obtained by oxidizing a zirconium nitride film at 500° C. was subjected to a heat treatment at 500° C., 600° C. and 700 to look into the behavior of crystallization of the zirconium oxynitride film. As shown in FIG. 8B, the zirconium oxynitride film in this embodiment of the present invention was not crystallized at 500° C. and 600° C., and exhibited a peak of crystal ($ZrO_2$) only when the zirconium oxynitride film was subjected to a heat treatment at 700° C. It follows that the crystallization temperature increased by 300° C. through adding nitrogen to zirconium oxide film.

The electrical characteristics of a laminate structure in this embodiment of the present invention, said laminate structure comprising a zirconium oxynitride film, a silicon oxynitride film and a silicon substrate, will now be described. FIG. 9 is a graph showing the C-V characteristics measured by forming a gold electrode on the laminated insulating film in this embodiment of the present invention. FIG. 9 shows a moderate C-V curve, supporting that the interface state density at the interface between the laminated insulating film and the silicon substrate is on a practical level in this embodiment of the present invention. Also, the equivalent oxide thickness of the interfacial insulating film was calculated on the basis of the accumulated capacitance of the C-V characteristics shown in FIG. 9. The thickness thus calculated was found to be about 1.2 nm, supporting that the interfacial insulating film sufficiently satisfies the performance of 1.5 nm or less equivalent oxide thickness in which a high-K gate insulating film is to be introduced.

Figure 10:
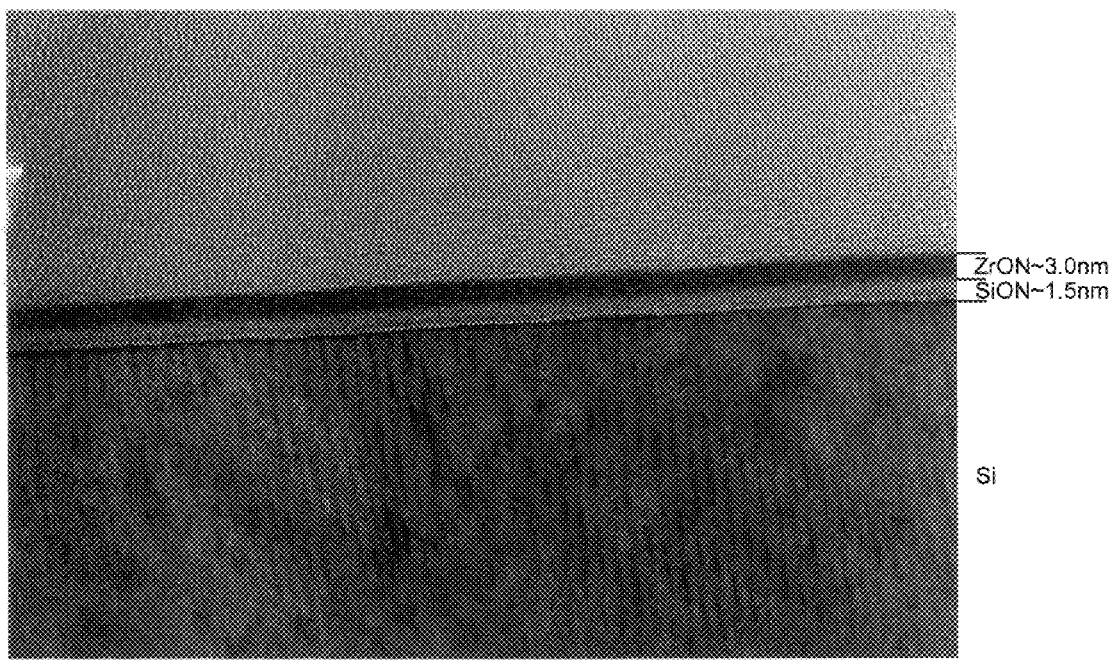
FIG. 10 is a TEM photograph showing a zirconium oxynitride film/interfacial insulating film laminate structure included in a MIS field effect transistor according to one embodiment of the present invention.

FIG. 10 is a TEM photograph showing a cross section of a laminate structure in this embodiment of the present invention exhibiting the C-V characteristics shown in FIG. 9, said laminate structure comprising a zirconium oxynitride film, a silicon oxynitride film and the silicon substrate. The physical thickness of the zirconium oxynitride film was 3 nm, and the physical thickness of the silicon oxynitride film was about 1.5 nm. The relative dielectric constant was measured on the basis of the structural feature noted above and the equivalent oxide thickness of the entire laminated film. The relative dielectric constant of the zirconium oxynitride film was found to be about 20, and the relative dielectric constant of the interfacial insulating film was found to be about 10. It should be noted that the interfacial insulating film in this embodiment of the present invention has a relative dielectric constant not larger than 10, which is higher than that of a pure silicon nitride film. Such being the situation, it has been confirmed that the interfacial insulating film formed at the interface between the zirconium oxynitride film and the silicon substrate is not a different silicon oxynitride film but is in the state that zirconium is added to the silicon oxynitride film. The particular construction can be achieved by the migration of the zirconium atoms locally present on the surface of the silicon substrate into the interfacial insulating film at the depositing time of the zirconium nitride film. Naturally, the particular construction can be obtained by only the manufacturing method according to this embodiment of the present invention.

It has been confirmed that the particular zirconium oxynitride film/silicon oxynitride film laminate structure in this embodiment of the present invention is capable of preventing sufficiently the silicon substrate from being oxidized again in the subsequent heat treating step.

FIG. 11 is a graph showing the experimental data supporting that the particular laminate structure of one embodiment of the present invention permits preventing the silicon substrate from being oxidized again in the subsequent heat treating step. Specifically, plotted on the graph of FIG. 11 are the experimental data on the change in the equivalent oxide thickness, covering the cases where an ordinary zirconium oxide film formed by the prior art and the zirconium oxynitride film formed in this embodiment of the present invention were annealed under a nitrogen gas atmosphere under temperatures falling within a range of between 600° C. and 1,000° C. In the case of the ordinary zirconium oxide film, an increase in the film thickness not smaller than 2.5 nm equivalent oxide thickness was observed when the annealing was performed at 1,000° C. On the other hand, an increase in the equivalent oxide thickness was also observed in the zirconium oxynitride film formed in this embodiment of the present invention in the case where the annealing treatment was performed under temperatures not lower than 900° C. However, the amount of increase was markedly smaller than that for the zirconium oxide film. Specifically, the increase in the case of the zirconium oxynitride film was only about 0.3 nm even under the annealing temperature of 1,000° C.

Several factors are considered to have improved the resistance to oxidation of the zirconium oxynitride film. A first factor is that the zirconium oxynitride film serves to prevent the oxygen atoms in the heat treating atmosphere from being diffused to suppress the oxidation of the silicon substrate. A second factor is that the silicon oxynitride film forming the interfacial insulating film serves to prevent the oxygen atoms from being diffused. Further, a third factor is that the zirconium oxynitride film has a high heat resistance, with the result that the amount of the oxygen released in the heat treating step under high temperatures is very small. Any of these factors is the effect produced by only the particular construction in this embodiment of the present invention.

In order to obtain an insulating film having a higher insulating capacitance, it is desirable to carry out the oxidation of the zirconium nitride film by using the oxygen under an excited state. If the oxidation is carried out by the particular technique, it is possible to carry out the oxidation of the zirconium nitride film with a higher efficiency. In addition, it is possible to prevent the silicon substrate from being oxidized again in the oxidizing step of the zirconium nitride film by lowering the substrate temperature required for the oxidation.

After formation of the zirconium oxynitride film, it is desirable to apply a post-annealing treatment to the zirconium oxynitride film under temperatures not lower than 600° C. and under an inert gas atmosphere, e.g., under a nitrogen gas atmosphere. By the application of the post-annealing treatment, it is possible to achieve simultaneously both the reduction of the leak current and the reduction in the equivalent oxide thickness.

FIG. 12 is a graph showing the change in the equivalent oxide thickness, etc., covering the case where the zirconium oxynitride film in this embodiment of the present invention is subjected to a post-annealing treatment. In the graph of FIG. 12, the equivalent oxide thickness is plotted on the abscissa, with the leak current density being plotted on the ordinate. According to the experimental data, the smallest equivalent oxide thickness and the performance of a low leak current were obtained in the case where the annealing treatment was carried out at 700° C. The particular effect is produced by the annealing-out of traces of lattice defect remaining in the zirconium oxynitride film.

As described above, the bonding state and the element construction of the insulating film are defined, with the result that the metal oxynitride film/interfacial insulating film laminate structure in this embodiment of the present invention is excellent in heat resistance, has a high relative dielectric constant, and is excellent in the resistance to oxidation. It should be noted that it is absolutely necessary to employ the manufacturing method according to this embodiment of the present invention for obtaining the metal oxynitride film/interfacial insulating film laminate structure producing the particular effects.

A MISFET (Metal-Insulator-Semiconductor Field Effect Transistor) according to embodiments of the present invention and manufacturing methods thereof will now be described with reference to the accompanying drawings.

EXAMPLE 1

Figure 13:
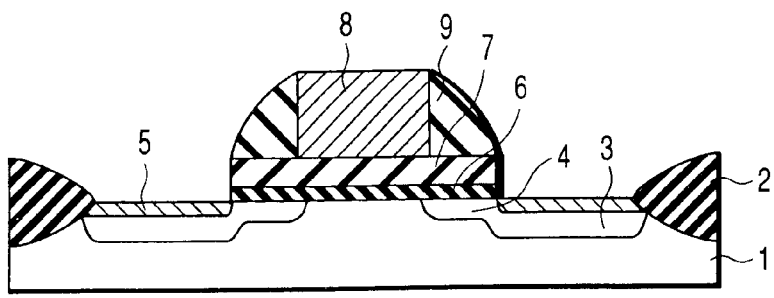
FIG. 13 is a cross sectional view showing the construction of a MISFET according to one embodiment of the present invention.

FIG. 13 is a cross sectional view showing the construction of a MISFET for this Example.

As shown in the drawing, a MIS structure of a laminate structure comprising a gate electrode 8, a metal oxynitride film 7 and an interfacial insulating film 6 is formed on a silicon substrate 1. The gate electrode 8 is surrounded by a gate side wall 9. A deep diffusion region 3 prepared by diffusing an impurity in a high concentration, a shallow diffusion region 4 and a salicide layer 5 are formed in the silicon substrate 1. These deep diffusion region 3, the shallow diffusion region 4 and the salicide layer 5 are formed by self-alignment with the MIS structure.

A method of manufacturing the MISFET for this Example will now be described with reference to FIGS. 14A to 14E.

Figure 14A:
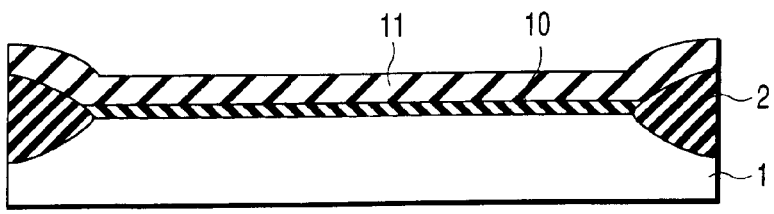
FIGS. 14A to 14E are cross sectional views collectively showing a method of manufacturing a MISFET according to one embodiment of the present invention.

In the first step, prepared is the silicon substrate 1 having an element isolating region 2 formed therein in advance by the ordinary process, as shown in FIG. 14A. The silicon substrate 1 is treated with a dilute aqueous solution of HF to remove the native oxide film from the surface of the silicon substrate 1. As a result, the surface of the silicon substrate 1 is terminated with hydrogen. Then, a metal nitride film is deposited on the silicon substrate 1. In this stage, it is possible for the surface of the silicon substrate 1 to be terminated with a halogen element in place of hydrogen. It is also possible for the surface of the silicon substrate 1 to be exposed to the outside, if the silicon substrate 1 is put under an environment in which the native oxidation up to the step of forming a metal nitride film is negligible.

Then, a metal nitride film, e.g., a zirconium nitride film, is deposited on the surface of the silicon substrate 1. In this Example, a zirconium nitride thin film was deposited by an RF sputtering method under an mixed gas atmosphere comprising an argon gas and a nitrogen gas by using a zirconium target. In this step, the silicon atoms in the surface region of the silicon substrate 1 are partly bonded to nitrogen atoms to form a silicon surface region 10 containing Si—N bonds and a zirconium nitride film 11 on the silicon surface region 10 as shown in the cross sectional view of FIG. 14A. The zirconium nitride film 11 was deposited under the sputtering conditions that the gas flow rate ratio of the argon gas stream to the nitrogen gas stream was set at 2:1, that the RF power was set at 50 to 300W, and that the silicon substrate 1 was not heated for the sputtering treatment.

The depositing method of the zirconium nitride film is not limited to the sputtering method. For example, it is possible to employ a chemical vapor deposition (CVD) method, a physical vapor deposition (PVD) method, a vapor deposition method utilizing a resistance heating, a vapor deposition method utilizing an electron beam, a vapor deposition method utilizing a molecular beam, and physical depositing methods such as a laser ablation method for depositing the zirconium nitride film. It is desirable to employ the sputtering method in view of the mass productivity. It is more desirable to employ the vapor deposition method utilizing an electron beam or the vapor deposition method utilizing a molecular beam in view of the damage introduced into the silicon substrate.

In the case of utilizing the chemical vapor deposition method (CVD method), it is particularly desirable to use as the raw material gas a mixed gas comprising a zirconium halide ($ZrCl_4$) gas and a nitrogen gas because, in the case of using an organic metal compound gas as the raw material gas, it is possible to avoid the oxidation of the silicon substrate caused by the oxygen atoms contained in the raw material gas and the deterioration of the electrical characteristics caused by contamination of the insulating film with carbon. It is possible to use, for example, $NH_3$, the excited nitrogen and $N_2$ as the raw material gas of nitrogen. It is more desirable to use the excited nitrogen because it is possible to lower the substrate temperature in the step of forming a film to make it possible to suppress the undesired oxidation of the silicon substrate.

It is also possible to deposit the zirconium nitride film on the silicon substrate by changing the atmosphere as follows. Specifically, in the first stage, a zirconium nitride film is deposited under an atmosphere containing nitrogen at least partially, followed by forming in the second stage a zirconium nitride film under an atmosphere containing nitrogen and oxygen at least partially. By forming a zirconium nitride film by this method, it is rendered possible to add traces of oxygen to the zirconium nitride film while suppressing the oxidation in the surface region of the silicon substrate. In this case, it is possible to obtain the effect of decreasing the leak current by adding oxygen in advance to the zirconium oxynitride film and, at the same time, to obtain a small equivalent oxide thickness.

Figure 14B:
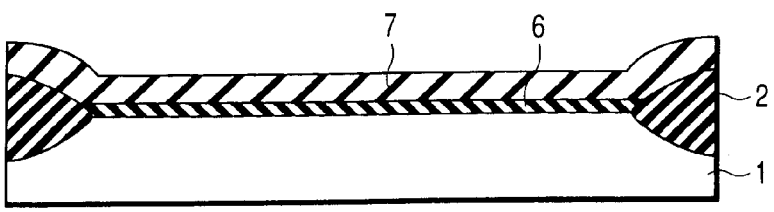

In the next step, the zirconium nitride film 11 and the silicon surface region 10 shown in FIG. 14A are oxidized to form a zirconium oxynitride film 7 and an interfacial insulating film 6 as shown in FIG. 14B. In the other word, the silicon substrate 10 and the zirconium nitride film 11 are annealed.

It is necessary to oxidize the zirconium nitride film 11 under the condition that the nitride film alone is selectively oxidized without oxidizing the substrate. To be more specific, it is effective to oxidize the silicon nitride film under the temperatures of about 400° C. to 600° C. If the oxidizing temperature is lower than 400° C., the metal nitride film is not sufficiently oxidized, with the result that the insulating properties of the film are deteriorated. On the other hand, if the oxidizing temperature exceeds 600° C., the substrate is also oxidized together with the metal nitride film, giving rise to the problem that the total thickness of the insulating film is increased to decrease the capacitance.

It is possible to employ the known oxidizing methods including, for example, the ordinary dry oxidation ($O_2$), wet oxidation ($O_2/H_2$), ozone oxidation ($O_3$), radical oxidation (excited oxygen), $N_2O$ oxidation, NO oxidation, $N_2/O_2$ oxidation, $Ar/O_2$ oxidation, and anodic oxidation (electrolyte or glow discharge). In the case of employing, for example, the dry oxidation method, it is desirable to carry out the oxidizing treatment for one minute or less in the case where the oxidizing temperature is set at 500° C. and to carry out the oxidizing treatment for 5 minutes or more in the case where the oxidizing temperature is set at 400° C. to optimize the leak current and the equivalent oxide thickness. Also, in the case of utilizing oxygen under an excited state as in the radical oxidation, it is possible to further shorten the oxidizing time and to obtain a smaller equivalent oxide thickness and a low leak current.

It is possible to decrease the equivalent oxide thickness and to lower the leak current by carrying out a high temperature heat treatment under an inert gas atmosphere after the zirconium oxidation. The high temperature heat treatment is a step for annealing out the defective structure remaining in the zirconium oxynitride film and the interfacial insulating film after the oxidizing treatment to increase the density of the film. It is desirable for the high temperature heat treatment to be carried out under temperatures of about 600° C. to 700° C.

Figure 14C:
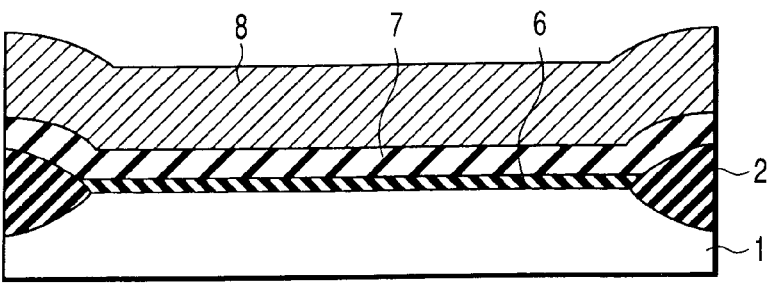

A gate electrode 8 is deposited on the zirconium oxynitride film 7 thus formed to obtain the structure shown in FIG. 14C. It is possible to use an optional material such as polycrystalline silicon (polysilicon), a refractory metal or a nitride of the refractory metal for forming the gate electrode 8. As already described, it is desirable for the high temperature annealing treatment of the zirconium nitride film after the oxidizing treatment to be carried out after deposition of the gate electrode 8. In this case, it is possible to obtain the effects of suppressing the thermal agglomeration of the zirconium oxynitride film accompanying the high temperature annealing treatment and of lowering the diffusion of oxygen from within the heat treatment atmosphere. It is desirable for the heat treatment to be carried out under temperatures not lower than 600° C. More desirably, the heat treatment should be carried out under temperatures falling within a range of between 900° C. and 1,050° C. Particularly, in the case of a polysilicon gate, it is most desirable for the high temperature heat treatment to be carried out simultaneously with the heat treatment for activating the gate electrode having impurity ions implanted thereinto, said activating heat treatment being carried out under temperatures higher than 1,000° C. On the other hand, in the case of a metal gate, it is most desirable to carry out the high temperature heat treatment simultaneously with the thermal activation treatment of the diffusion layer that is carried out under temperatures not higher than 900° C.

Figure 14D:
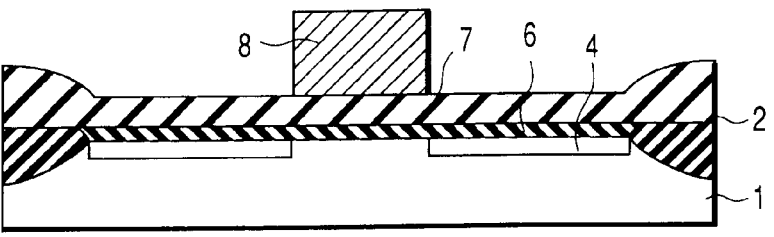

In the next step, the gate electrode 8 is processed into a desired shape, and the shallow diffusion layer region 4 is formed by self-alignment with the shape of the gate electrode to obtain the structure shown in FIG. 14D. In this Example, the zirconium oxynitride film 7 and the interfacial insulating film 6 are not processed in the step of processing the gate electrode 8 to remain in the active region on the surface of the silicon substrate 1. It follows that the ion implantation for forming the shallow diffusion layer region 4 is carried out through these insulating films. It is also possible to carry out the ion implantation after removal of the zirconium oxynitride film 7 and the interfacial insulating film 6 to form the shallow diffusion layer region.

Figure 14E:
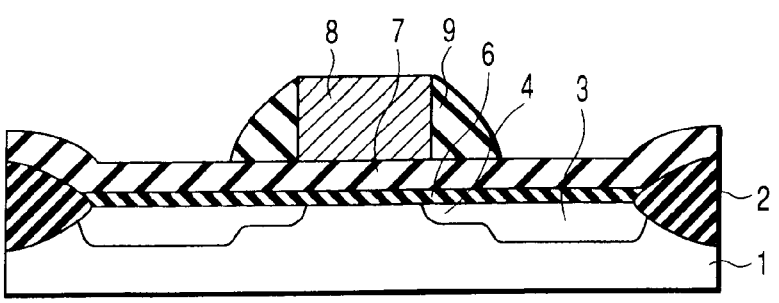

Further, a gate side wall 9 is formed, followed by forming a deep diffusion layer 3 to obtain the structure shown in FIG. 14E. Finally, those portions of the zirconium oxynitride film 7 and the interfacial insulating film 6 which are positioned above the deep diffusion layer 3 are removed, followed by forming a salicide film 5 by the ordinary process to obtain the MISFET shown in FIG. 13.

EXAMPLE 2

Figure 15:
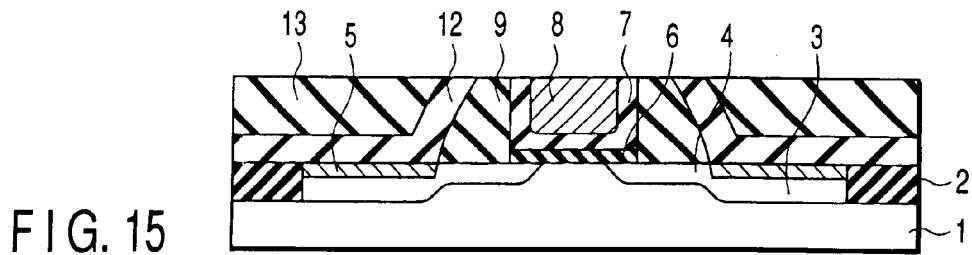
FIG. 15 is a cross sectional view showing the construction of a MISFET according to another embodiment of the present invention.

FIG. 15 is a cross sectional view showing the construction of a MISFET for Example 2.

As shown in the drawing, a MIS structure provided by a laminated structure comprising a gate electrode 8, a metal oxynitride film 7 and an interfacial insulating film 6 is formed in a surface region of a silicon substrate 1 having an element separating region 2 formed therein. The MIS structure noted above is surrounded by a gate side wall 9, a SiN film 12 and a $SiO_2$ film 13. Also, a deep diffusion region 3 having an impurity of a high concentration diffused therein, a shallow diffusion region 4 and a salicide film 5, which are self-aligned with the MIS structure, are formed in the silicon substrate 1.

Figure 16A:
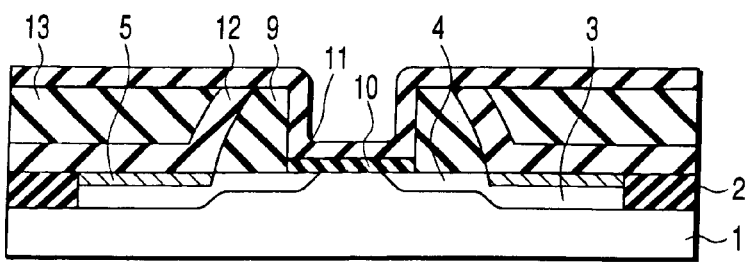
FIGS. 16A and 16B are cross sectional views collectively showing a method of manufacturing a MISFET according to another embodiment of the present invention.

The method of manufacturing the MISFET of the construction shown in FIG. 15 will now be described with reference to FIGS. 16A and 16B.

In the first step, the shallow diffusion layer region 4, the deep diffusion layer region 3 and the salicide film 5 were formed by the so-called "replacement gate system" in the silicon substrate 1 by the ordinary process. Further, formed were the gate side wall 9, the SiN film 12 and the $SiO_2$ film 13, followed by forming an open portion through these films to provide a region in which the gate MIS structure was to be formed. After formation of the open portion, the zirconium nitride film 11 was formed over the silicon substrate 1 as in the first embodiment (Example 1). Since it is necessary to deposit the zirconium nitride film 11 to cover the side wall portion of the open portion in the second embodiment (Example 2) as shown in FIG. 16A, it is desirable to form the zirconium nitride film 11 by a CVD method.

Figure 16B:
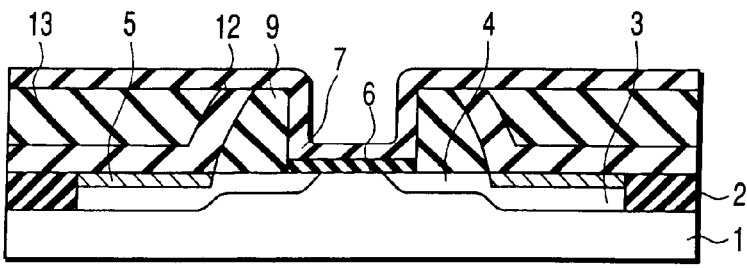

In the next step, an oxidizing treatment was applied as in the first embodiment to form a laminate structure comprising the zirconium oxynitride film 7 and the interfacial insulating film 6, thereby obtaining the structure shown in FIG. 16B.

Further, a gate electrode material was deposited, followed by planarizing the deposited gate electrode material by a CMP (Chemical Mechanical Polishing) method to obtain the MISFET constructed as shown in FIG. 15. It is desirable to carry out the post-annealing treatment for further improving the performance of the zirconium oxynitride film after formation of the zirconium oxynitride film or immediately after formation of the gate electrode. In the case of the second embodiment, the heat treating temperature is limited not to exceed 800° C. Further, it is desirable to carry out the heat treatment under temperatures falling within a range of between 600° C. and 650° C. to decrease the leak current as much as possible.

EXAMPLE 3

A method of forming a ZrSiON single layer insulating film will now be described with reference to FIGS. 17A to 17C.

Figures 17A, 17B:
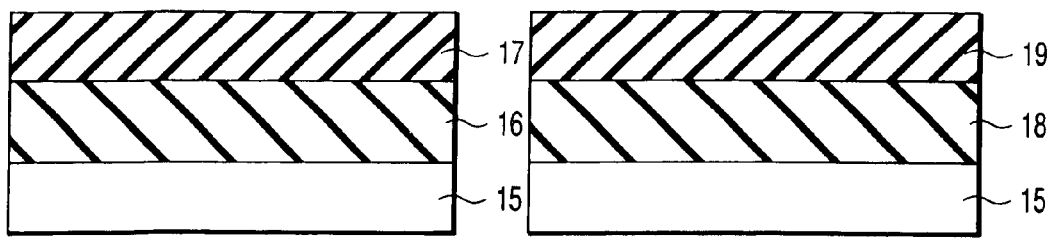
FIGS. 17A to 17C are cross sectional views collectively showing a method of manufacturing a MISFET according to another embodiment of the present invention.

In the first step, a zirconium nitride film (ZrN) 17 is formed over the surface of a silicon substrate 15 by the method similar to that employed in Example 1, as shown in FIG. 17A. In this step, an interfacial insulating film 16 is formed in the interface between the ZrN film 17 and the silicon substrate 15. The interfacial insulating film 16, which contains silicon, oxygen and nitrogen, can also be formed by oxynitriding the surface of the silicon substrate 15 before formation of the ZrN film 17. Alternatively, it is possible to form the interfacial insulating film 16 by oxynitriding the surface of the silicon substrate 15 in the step of depositing ZrN.

Further, an oxidizing treatment is applied to the ZrN film 17 by the method similar to that employed in Example 1 to obtain the structure shown in FIG. 17B. As a result, formed is a laminate structure comprising the zirconium oxynitride film (ZrON film) 19 and the interfacial insulating film 18. In this step, the interfacial insulating film 18 contains silicon, oxygen and nitrogen. Further, zirconium atoms are added to the interfacial insulating film 18 in an amount not larger than 10 atomic percent. Still further, it is desirable for the nitrogen atoms to be contained in an amount not larger than 10 atomic percent. In view of the requirement for improving the resistance to the impurity diffusion while suppressing the defective structure, it is more desirable for the nitrogen content to be 2 to 3 atomic percent. The interfacial insulating film 18 is hereinafter referred to as a ZrSiON film.

Figure 17C:
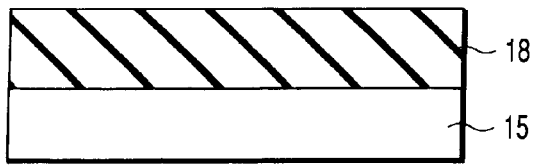

In the next step, the ZrON film 19 is selectively removed from the ZrSiON film 18 to obtain a ZrSiON single layer insulating film, as shown in FIG. 17C. The ZrON film 19 can be removed by using, for example, a 0.1% aqueous solution of hydrofluoric acid. For reasons described below, it is possible to set the selectivity ratio of the ZrON film 19 to the ZrSiON film 18 relative to the etching solution at a very large value, i.e., typically 10 or more. The ZrON film 19 in the third embodiment (Example 3) exhibits properties of a $ZrO_2$ film in terms of the bonding of the atoms. On the other hand, the ZrSiON film 18 in the third embodiment is basically a silicon oxynitride film (SiON film). It is considered reasonable to understand that zirconium atoms are added to the silicon oxynitride film to form the ZrSiON film 18 in the third embodiment of the present invention. It should be noted that $ZrO_2$ is easily soluble in, for example, a hydrofluoric acid solution, though the SiON film is relatively low in the solubility in the hydrofluoric acid solution. Such being the situation, it is possible to ensure a large selectivity ratio not lower than 10.

The resultant ZrSiON insulating film 18 permits maintaining the amorphous state even under a high temperature of about 1,000° C., and the relative dielectric constant of the insulating film 18 can be increased to about 6 to 12. In addition, the ZrSiON insulating film 18, which is basically a SiON film, exhibits high insulating properties and, thus, is highly adapted for use as a gate insulating film.

Further, in the manufacturing method in the third embodiment, zirconium atoms are added to the surface region of the interfacial insulating film 18 on the side opposite to the side of the silicon substrate 15 in the process of forming the interfacial insulating film 18 and the ZrON film 19 to form the ZrSiON film. In the ZrSiON film 18 formed by adding zirconium atoms in this fashion has a high zirconium concentration, e.g., the zirconium concentration on the order of $10^{20}$/cc, on the surface of the film. On the other hand, naturally obtained is the feature that the zirconium atom concentration in the vicinity of the interface with the silicon substrate 15 is lowered to, for example, about $10^{17}$/cc. In order to improve the interfacial characteristics, it is absolutely necessary for the zirconium atom concentration to be low in the vicinity of the interface with the silicon substrate 15 to improve the performance of the ZrSiON film 18 in the third embodiment of the present invention.

A gate electrode is formed on the ZrSiON single layer insulating film 18 shown in FIG. 17C by the process described previously with reference to FIG. 14C et seq. in conjunction with Example 1, followed by forming a shallow diffusion layer region, a gate side wall, a deep diffusion layer region, etc. to obtain the MISFET for the third embodiment of the present invention.

EXAMPLE 4

A method of manufacturing a ZrSiON film will now be described with reference to FIGS. 18A and 18B.

Figure 18A:
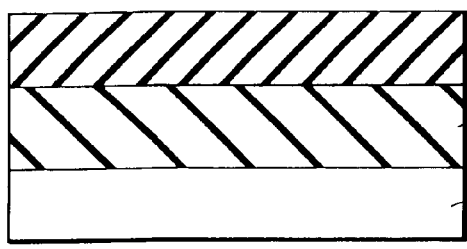
FIGS. 18A and 18B are cross sectional views collectively showing a method of manufacturing a MISFET according to another embodiment of the present invention.

In the first step, a zirconium silicon nitride film (ZrSiN film) 22 was formed over the surface of a silicon substrate 15, as shown in FIG. 18A. The zirconium silicon nitride film 22 can be formed by, for example, a sputtering method using a ZrSi target and a mixed gas comprising a nitrogen gas and an argon gas. Alternatively, it is possible to form the zirconium silicon nitride film 22 by using a ZrSiN target in the presence of an argon gas alone or a mixed gas comprising a nitrogen gas and an argon gas. It is also possible to form a film by using a ZrSiO target in the presence of a mixed gas comprising a nitrogen gas and an argon gas to prepare a ZrSiN film containing a small amount of oxygen. Further, it is possible to form a film of the same properties by a CVD method or a vacuum vapor deposition method. In the embodiment of Example 4, an interfacial insulating film 21 was formed at the interface between the ZrSiN film 22 and the silicon substrate 15, as shown in FIG. 18A. The interfacial insulating film 21, which contains silicon, oxygen and nitrogen, can be formed before formation of the ZrSiN film 22 by oxynitriding the surface of the silicon substrate 15. Alternatively, it is also possible to form the interfacial insulating film 21 by oxynitriding the surface of the silicon substrate 15 in the step of depositing the ZrSiN film 22. Further, it is possible for nitrogen atoms to be mixed in a silicon oxide film in the step of depositing the ZrSiN film 22 on the silicon substrate 15 covered with the silicon oxide film to form a silicon oxynitride film.

Figure 18B:
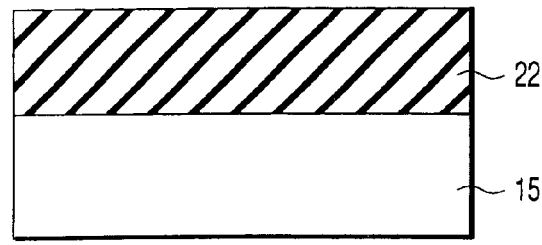

Further, an oxidizing treatment was applied to the ZrSiN film 22 by the method similar to that employed in Example 1 to obtain a ZrSiON single layer insulating film 23 as shown in FIG. 18B. In the stage of forming the ZrSiN film 22, the interfacial insulating film 21 is a SiON film or in the state that zirconium atoms are partly added to the SiON film. The ZrSiN film 22 is converted into a ZrSiON film 23 because zirconium atoms are taken into the interfacial insulating film to form an atomic bond when the ZrSiN film 22 is subjected to an oxidizing treatment.

The ZrSiON film 23 formed in this Example has a gradient of the zirconium atom concentration in a direction perpendicular to the film. To be more specific, a gradient of the zirconium atom concentration is naturally formed such that the zirconium atom concentration is low in the vicinity of the interface with the silicon substrate 15 and is gradually increased toward the surface of the ZrSiON film 23. For example, the zirconium atom concentration is high, i.e., about $10^{20}$ to $10^{21}$ atoms/cc, in the surface region of the ZrSiON film 23 because the ZrSiON film was originally a ZrSiN film 22. On the other hand, the region in the vicinity of the interface with the silicon substrate 15 was originally formed of a material containing silicon and oxygen or nitrogen and, then, zirconium ions were implanted in the process of forming the ZrSiN film 22 or the zirconium atoms were thermally diffused by the thermal history in the stage of applying an oxidizing treatment. It follows that the zirconium atom concentration in the region in the vicinity of the silicon substrate 15 is only $10^{17}$ atoms/cc or less. The particular gradient in the concentration of the zirconium atoms inside the ZrSiON film 23, which is a special structure formed by only the method in the fourth embodiment (Example 4), produces the effect of satisfying simultaneously two requirements of the improvement in the interfacial characteristics with the silicon substrate 15 and the increase in the insulating film capacitance caused by the improvement in the dielectric constant.

A gate electrode is formed on the ZrSiON single layer insulating film 23 shown in FIG. 18B by the process shown in FIG. 14C et seq. referred to previously in conjunction with Example 1, followed by forming a shallow diffusion layer region, a gate side wall and a deep diffusion layer region to obtain the MISFET for Example 4.

EXAMPLE 5

A method of forming a ZrSiON single layer insulating film will now be described with reference to FIGS. 19A and 19B.

Figure 19A:
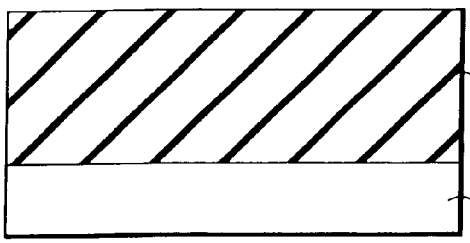
FIGS. 19A and 19B are cross sectional views collectively showing a method of manufacturing a MISFET according to another embodiment of the present invention.

In the first step, a ZrSiN film 22 is formed on the surface of a silicon substrate 15 as shown in FIG. 19A by the method similar to that employed in Example 4. Example 5 differs from Example 4 in that an interfacial insulating film is not formed in Example 5 between the silicon substrate 15 and the ZrSiN film 22. The particular construction shown in FIG. 19A can be obtained by lowering the partial pressure of oxygen within the atmosphere to $10^{-6}$ Torr or less. The effect produced by Example 5 is not lost even if traces of oxygen atoms contained in the atmosphere are taken into the ZrSiN film 22.

Figure 19B:
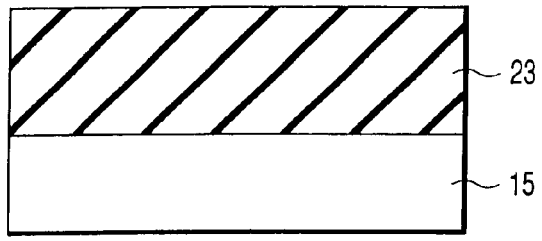

In the next step, an oxidizing treatment is applied to the ZrSiN film 22 by the method similar to that employed in Example 1 to obtain a ZrSiON single layer insulating film 23 shown in FIG. 19B. The zirconium atom concentration in the film of the particular construction is rendered substantially uniform, and the film exhibits a very high relative dielectric constant, which is not smaller than 12. The film was analyzed by an XPS in order to look into the state of the atomic bond in the ZrSiON single layer insulating film 23 thus formed. It has been found that all the Zr atoms were bonded O atoms, and Si atoms were bonded to both of O atoms and N atoms. It is considered reasonable to state that the N atoms were bonded to O, N, H or Si atoms within the ZrSiON single layer insulating film 23.

Incidentally, it is known to the art that the interfacial characteristics are deteriorated in the case where zirconium atoms are present in a region excessively close to the silicon substrate 15. It follows that, where an importance is placed on, particularly, the performance in respect of the interfacial characteristics, it is possible to form a silicon oxide film (not shown) at the interface between the ZrSiON film 23 and the silicon substrate 15 shown in FIG. 19B. For example, oxygen atoms are diffused to reach the interface between the ZrSiON film 23 and the silicon substrate 15, if an oxidizing treatment is carried out under temperatures of 500° C. to 600° C., to oxidize the silicon substrate 15 in the interfacial region and, thus, to form a silicon oxide film. It should be noted that the oxygen diffusion rate is very high within the ordinary $ZrO_2$ film or the ZrSiO film, with the result that the silicon substrate 15 is oxidized highly rapidly. It follows that it is difficult to control the thickness of the silicon oxide film thus formed. In Example 5, however, the diffusion of oxygen atoms is limited by the function of the nitrogen atoms added to the ZrSiON film 23 to make it possible to design the thickness of the interfacial oxide film with a broader process window.

A gate electrode is formed on the ZrSiON single layer insulating film 23 shown in FIG. 19B by the process shown in FIG. 14C et seq. referred to previously in conjunction with Example 1, followed by forming a shallow diffusion layer region, a gate side wall and a deep diffusion layer region to obtain the MISFET for Example 5.

EXAMPLE 6

The construction of a laminate structure comprising an upper interfacial film, a ZrON film and a SiON(Zr) film and a method of forming the particular laminate structure will now be described with reference to FIGS. 20A and 20B.

Figure 20A:
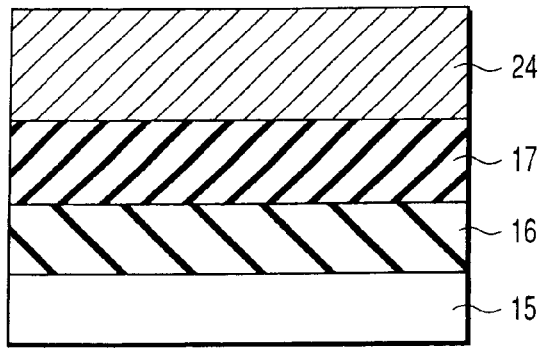
FIGS. 20A and 20B are cross sectional views collectively showing a method of manufacturing a MISFET according to another embodiment of the present invention.

FIG. 20A is a cross sectional view schematically showing the construction immediately after deposition of an interfacial insulating film 16, a ZrON film 17 and a gate electrode material layer 24 on a silicon substrate 15. The laminate structure of the ZrON film 17 and the interfacial insulating film 16 is formed by the method described previously.

Figure 20B:
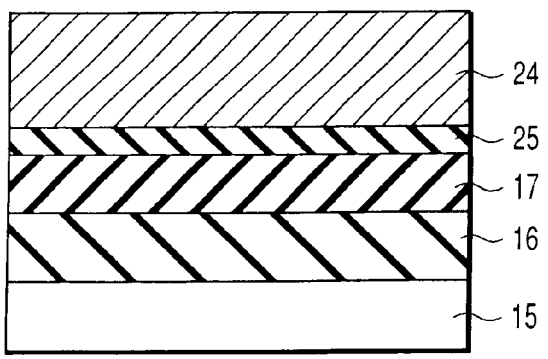

FIG. 20B is a cross sectional view schematically showing the state immediately after the structure shown in FIG. 20A is subjected to a heat treatment under high temperatures of about 900 to 1,050° C. under a non-oxidizing atmosphere. As shown in the drawing, a very thin insulating film layer 25 (hereinafter referred to as an upper interfacial layer) containing the gate electrode material and oxygen or nitrogen is formed at the interface between the ZrON film 17 and the gate electrode material layer 24. The extra oxygen present in an excessively large amount in the ZrON film 17 and the nitrogen contained in the ZrON film 17 are migrated into the upper interfacial layer 25. The thickness of the upper interfacial film 25 is determined in a self-limitative fashion by the oxygen content or the nitrogen content and, thus, is suppressed to a very thin physical film thickness, i.e., typically 5 Å or less. It is desirable for the nitrogen content of the upper interfacial film to be not higher than 10%, more desirably, to be about 2 to 3 atomic percent in the sense that the resistance to the impurity diffusion is sufficiently exhibited and that the defect formation is not generated. If the nitrogen content exceeds 10%, defects derived from nitrogen inside the upper interfacial film tend to be formed to deteriorate the electrical characteristics.

The function performed by the upper interfacial film 25 thus formed markedly differs depending on the gate electrode material layer 24 and the residual oxygen concentration in the ZrON film 17.

The case where the gate electrode material layer 24 is formed of silicon will now be described first. The upper interfacial film 25 formed by an annealing treatment under a nitrogen gas atmosphere of, for example, 1,000° C. is a SiON film formed by the addition of N coming from the ZrON film.

It is reasonable to understand that the upper interfacial film 25 is a very thin insulating film containing silicon, oxygen and nitrogen. This has been confirmed as follows. Specifically, in the structure shown in FIG. 20B, the gate electrode material layer 24, which is formed of polysilicon in this case, is removed by the treatment with an alkali solution. The silicon removal is selectively performed relative to the upper insulating film 25. The upper interfacial film 25 thus exposed was analyzed by XPS, which is a high sensitivity surface element analytical technology. As a result, it has been found that the upper interfacial film 25 is an insulating film containing silicon-oxygen bonds and silicon-nitrogen bonds. Also, the thickness of the upper interfacial film 25 has been found to be 2 to 5 Å from the XPS analysis and the TEM analysis. Further, the nitrogen concentration inside the upper interfacial film 25 was examined in detail by an angle-resolved XPS. It has been found that the nitrogen atoms are not uniformly distributed inside the upper interfacial film 25 but are localized in the interface with the metal oxynitride film 17. The local distribution of the nitrogen atoms is derived from the fact that the nitrogen atoms constituting the upper interfacial film 25 were migrated from the metal oxynitride film 17.

It is possible for a small amount of zirconium atoms, e.g., not larger than 5 atomic percent of zirconium atoms, to be thermally diffused from the ZrON film 17 into the upper interfacial film 25. The upper interfacial film in this case is a SiON(Zr) film that performs the function as follows. Specifically, the construction of the interface between the ZrON film 17 and the silicon gate electrode material layer 24 is stabilized to lower the electrical trapping amount. In addition, the diffusion of an impurity such as boron and arsenic from the silicon gate material layer 24 is prevented.

The case where the gate electrode material layer 24 is formed of a refractory metal such as titanium, tungsten, tantalum or molybdenum will now be described. In this case, the function performed by the upper interfacial film 25 quite differs depending on the aspect as to whether or not an extra oxygen is further present in the ZrON film 17.

Where an extra oxygen is present in the ZrON film 17, an insulating film, in which nitrogen is added to the oxide of the gate electrode material, is formed at the interface between the ZrON film 17 and the gate electrode material layer 24. For example, a TiON film or a WON film is formed as the upper interfacial film 25 at the interface between the ZrON film 17 and the gate electrode material layer 24. The upper interfacial film 25 thus formed performs the function of stabilizing the structure at the interface between the gate electrode material layer 24 and the ZrON film 17 to suppress the electrical defect.

On the other hand, where an extra oxygen is not present in the ZrON film 17, a metal nitride film is formed as the upper interfacial film 25 at the interface between the ZrON film 17 and the gate electrode material layer 24. In the case of the refractory metals referred to above, the metal nitride is an electrically conductive material and, thus, the upper interfacial film 25 acts as a part of the gate electrode 24.

In the Examples described above, a zirconium oxynitride film was taken up as an example. However, the oxynitride film included in the MISFET of the present invention is not limited to the zirconium oxynitride film. It is possible to substitute hafnium, lanthanoide series metals, or a mixture thereof for zirconium used in the Examples described above, with exactly the same effect.

As described above, the present invention provides a MIS field effect transistor comprising a gate insulating film containing a high-K material and having a relative dielectric constant substantially equal to that of a metal oxide. The present invention also provides a method of manufacturing a MIS field effect transistor comprising a gate insulating film capable of prominently suppressing the crystallization of the high-K material in the step of a heat treatment to improve the resistance to heat and having a relative dielectric constant substantially equal to that of a metal oxide.

As described above, the present invention has made it possible to provide a low power consumption LSI operable at a high speed, said LSI comprising a high-K gate insulating film of a high performance, compared with the prior art, that the leak current is low and that the insulating film capacitance is very high. Of course, the present invention has a prominently high industrial value.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a MIS field effect transistor, comprising:

supplying at least one metal selected from the group consisting of zirconium, hafnium and a lanthanide series metal over a surface of a silicon substrate together with nitrogen to form a metal nitride film;

annealing said surface of said silicon substrate and said metal nitride film to convert said metal nitride film into metal oxynitride film and to form an insulating film containing at least one of nitrogen and oxygen and silicon between said surface of said silicon substrate and said metal oxynitride film, thus obtaining a gate insulating film; and forming a gate electrode on said gate insulating film.

2. The method according to claim 1, wherein said annealing is performed under temperatures falling within a range of between 400° C. and 600° C.

3. The method according to claim 1, further comprising:

forming a silicon oxynitride film on said silicon substrate before formation of said metal nitride film over said silicon substrate;

adding said metal contained in said metal oxynitride film to said silicon oxynitride film by said annealing to have a concentration gradient in the thickness direction of the film; and peeling off said metal oxynitride film before formation of said gate electrode.

4. The method according to claim 1, wherein said gate electrode is formed by depositing a gate electrode material layer on said metal oxynitride film, followed by heating said gate electrode material layer, and a film containing said gate electrode material and at least one of oxygen and nitrogen is formed between said metal oxynitride film and said gate electrode material layer.

5. The method according to claim 1, wherein said gate electrode material contains silicon.

6. The method according to claim 1, wherein said metal oxynitride film is formed by depositing a film under an atmosphere containing nitrogen under an excited state to form silicon-nitrogen bonds in at least a part of the surface of said silicon substrate.

7. The method according to claim 1, wherein said metal oxynitride film is formed under a first atmosphere containing nitrogen and, then, under a second atmosphere containing oxygen and nitrogen.

8. The method according to claim 1, wherein said metal oxynitride film further contains silicon.

9. The method according to claim 1, wherein said annealing is performed by radical oxidation process.

10. The method according to claim 1, further comprising heating said metal oxynitride film under an inert gas atmosphere at temperatures not lower than 600° C.

11. The method according to claim 1, wherein said heating under an inert gas atmosphere is performed after formation of a gate electrode on said gate insulating film.

* * * * *